(12) United States Patent
Oshima et al.

(10) Patent No.: US 11,804,519 B2
(45) Date of Patent: Oct. 31, 2023

(54) CRYSTALLINE MULTILAYER STRUCTURE, SEMICONDUCTOR DEVICE, AND METHOD OF MANUFACTURING CRYSTALLINE STRUCTURE

(71) Applicants: FLOSFIA INC., Kyoto (JP); National Institute for Material Science, Ibaraki (JP)

(72) Inventors: Yuichi Oshima, Ibaraki (JP); Katsuaki Kawara, Kyoto (JP)

(73) Assignees: FLOSFIA INC., Kyoto (JP); NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 30 days.

(21) Appl. No.: 17/239,931

(22) Filed: Apr. 26, 2021

(65) Prior Publication Data

US 2021/0335995 A1  Oct. 28, 2021

(30) Foreign Application Priority Data

Apr. 24, 2020 (JP) ................................. 2020-077067
Apr. 24, 2020 (JP) ................................. 2020-077068

(51) Int. Cl.
*H01L 29/04* (2006.01)
*H01L 21/02* (2006.01)
*H01L 29/24* (2006.01)

(52) U.S. Cl.
CPC ........ *H01L 29/045* (2013.01); *H01L 21/0242* (2013.01); *H01L 21/02433* (2013.01);
(Continued)

(58) Field of Classification Search
CPC .............. H01L 29/045; H01L 21/0242; H01L 21/02433; H01L 21/02565; H01L 21/02595; H01L 21/02609; H01L 29/247
See application file for complete search history.

(56) References Cited

U.S. PATENT DOCUMENTS 10,943,981 B2 * 3/2021 Sugimoto ............. H01L 29/045
11,508,755 B2 * 11/2022 Huang ..................... H01L 28/55
(Continued)

FOREIGN PATENT DOCUMENTS

| JP | 5343224 | 11/2013 |
| JP | 5397794 | 1/2014 |

(Continued)

OTHER PUBLICATIONS

Y. Oshima et al., "Epitaxial Lateral Overgrowth of α-$Ga_2O_3$ by Halide Vapor Phase Epitaxy", APL Mater. 7, 022503 (2019), pp. 7.022503-7.022503-6; https://doi.org/10.1063/1.5051058.
(Continued)

*Primary Examiner* — Eduardo A Rodela
(74) *Attorney, Agent, or Firm* — Wenderoth, Lind & Ponack, L.L.P.

(57) ABSTRACT

A crystalline multilayer structure having a high-quality crystalline layer and a semiconductor device employing such a crystalline multilayer structure are provided. A crystalline multilayer structure, including a first crystalline layer having a first crystal, and a second crystalline layer stacked on the first crystalline layer and having a second crystal, wherein the first crystal includes polycrystalline κ-$Ga_2O_3$ and the second crystal is a single crystal of a crystalline oxide.

11 Claims, 12 Drawing Sheets

(52) U.S. Cl.
CPC .. *H01L 21/02565* (2013.01); *H01L 21/02595* (2013.01); *H01L 21/02609* (2013.01); *H01L 29/247* (2013.01)

(56) References Cited

U.S. PATENT DOCUMENTS

| | | | |
|---|---|---|---|
| 11,522,103 B1* | 12/2022 | Atanackovic | H01L 29/24 |
| 2019/0057865 A1 | 2/2019 | Oshima et al. | |
| 2021/0320179 A1* | 10/2021 | Sugimoto | H01L 29/0657 |
| 2022/0029022 A1* | 1/2022 | Watanabe | H01L 29/7869 |

FOREIGN PATENT DOCUMENTS

| | | |
|---|---|---|
| JP | 5397795 | 1/2014 |
| JP | 2014-072533 | 4/2014 |
| JP | 2016-098166 | 5/2016 |
| JP | 2016-100592 | 5/2016 |
| JP | 2016-100593 | 5/2016 |
| JP | 2016-155714 | 9/2016 |
| JP | 2019-034883 | 3/2019 |
| WO | 2014/050793 | 4/2014 |

OTHER PUBLICATIONS

K. Kaneko, "Growth and Physical Properties of Corundum-Structured Gallium Oxide Alloy Thin Films", Thesis, Mar. 25, 2013, Kyoto University, Kyoto University Research Information Repository, https://doi.org/10.14989/doctor.k17573, pp. 1-116, with English Abstract.

* cited by examiner

CRYSTALLINE MULTILAYER STRUCTURE, SEMICONDUCTOR DEVICE, AND METHOD OF MANUFACTURING CRYSTALLINE STRUCTURE

TECHNICAL FIELD

The disclosure relates to a crystalline multilayer structure, a semiconductor device, and a method of manufacturing a crystalline structure useful for manufacturing a semiconductor device.

BACKGROUND

As a next-generation switching device capable of realizing high withstand voltage, low loss, and high heat resistance, a semiconductor device using gallium oxide ($Ga_2O_3$) having a large band gap is attracting attention, and application to power semiconductor devices such as inverters is expected. Due to its wide band gap, wide range of applications as light receiving and receiving devices such as LEDs and sensors is also expected. In particular, band gap of $\alpha$-$Ga_2O_3$ having the corundum structure among gallium Oxides can be controlled by making mixed crystal together with indium or aluminum, respectively or in combination. Gallium oxide constitutes an extremely attractive material system as a InAlGaO based semiconductor. Here, InAlGaO based semiconductor indicates a $In_xAl_yGa_zO_3$ ($0 \leq X \leq 2$, $0 \leq Y \leq 2$, $0 \leq Z \leq 2$, $X+Y+Z=1.5$ to $2.5$), and can be viewed as the same material system including gallium Oxide.

However, since the most stable phase of gallium oxide has the $\beta$-Gallia structure, a special deposition method must be applied in order to form a crystal film having the corundum structure of a metastable phase. Also, since the $\alpha$-$Ga_2O_3$ with the corundum structure is a metastable phase, the bulk-substrate with the melt-crystal growth structure is not applicable. For this reason, sapphire substrate having the same structure as $\alpha$-$Ga_2O_3$ is used. However, since $\alpha$-$Ga_2O_3$ and sapphire have a large degree of lattice-mismatch, $\alpha$-$Ga_2O_3$ crystal films heteroepitaxially grown on sapphire substrates tend to have high dislocation densities. In addition to the issues of the crystal film having the corundum structure, there are other issues such as improvement of the deposition rate and crystal quality, suppression of cracks and abnormal growth, suppression of twin, and cracking of substrates due to warpage. Under such circumstances, several studies have been conducted on the deposition of a crystalline semiconductor having the corundum structure.

Japanese Patent No. 5397794 discloses a method for manufacturing an oxide crystal thin film by a mist CVD method using bromide or iodide of gallium or indium. Japanese Patent No. 5343224, Japanese Patent No. 5397795, and Japanese Patent Application Publication No. 2014-72533 disclose a multilayer structure in which a semiconductor layer having the corundum-type crystal structure and an insulating film having the corundum-type crystal structure are formed on a base substrate having the corundum-type crystal structure. As in Japanese Patent Application Publication No. 2016-100592, Japanese Patent Application Publication No. 2016-98166, and Japanese Patent Application Publication No. 2016-100593, deposition by mist CVD has also been studied using an ELO (Epitaxial Lift-Off) substrate or void formation. These methods, however, are yet satisfactory in terms of compatibility between crystal quality and large area of deposition. A crystal film having a large area and excellent crystal quality has been desired.

Japanese Patent Application Publication No. 2016-155714 discloses that gallium oxide having the corundum structure is deposited by a HVPE (Hydride Vapor Phase Epitaxy) method using a gallium raw material and an oxygen raw material. In addition, Oshima, Y., et al. "Epitaxial lateral overgrowth of $\alpha$-$Ga_2O_3$" APL Materials 7 2 (2019): 022503 discloses the use of a HVPE method to deposit a gallium oxide on an ELO substrate. However, since the $\alpha$-$Ga_2O_3$ is a metastable phase, it is difficult to deposit a film like the $\beta$-$Ga_2O_3$. It has been difficult to deposit a thick film having a low dislocation density.

SUMMARY

An object of the disclosure is to provide a crystalline multilayer structure and a semiconductor device having a high-quality crystalline layer, and a method of manufacturing a crystalline multilayer structure capable of industrially obtaining the crystalline multilayer structure.

As a result of intensive studies to achieve the above object, the inventors formed a crystalline multilayer structure comprising, a first crystalline layer having a first crystal, and a second crystalline layer stacked on the first crystalline layer and having a second crystal, wherein the first crystal includes polycrystalline $\kappa$-$Ga_2O_3$ and the second crystal is a single crystal of a crystalline oxide. Then, it has been found that the quality such as crystallinity of the second crystalline layer in the obtained crystalline multilayer structure is excellent.

According to such a crystalline multilayer structure, it has been found that the above-described problem can be solved.

In other words, embodiments of the disclosure are as follows.

[1] A crystalline multilayer structure, including a first crystalline layer having a first crystal, and a second crystalline layer stacked on the first crystalline layer and having a second crystal, wherein the first crystal includes polycrystalline $\kappa$-$Ga_2O_3$ and the second crystal is a single crystal of a crystalline oxide.

[2] The crystalline multilayer structure according to [1], wherein the first crystalline layer is formed on a mask layer.

[3] The crystalline multilayer structure according to [1] or [2], wherein the dislocation density of the second crystalline layer is $1 \times 10^7 / cm^2$ or less.

[4] The crystalline multilayer structure according to any one of [1] to [3], wherein the crystalline oxide includes at least one metal selected from aluminum, indium, and gallium.

[5] The crystalline multilayer structure according to any one of [1] to [4], wherein the crystalline oxide includes at least gallium.

[6] A crystalline multilayer structure according to any of [1] to [5], wherein the crystalline oxide has the corundum structure.

[7] A crystalline multilayer structure, including a crystalline substrate, a first crystalline layer stacked on the crystalline substrate and having a first crystal, and a second crystalline layer stacked on the first crystalline layer and having a second crystal, wherein the first crystal includes polycrystalline $\kappa$-$Ga_2O_3$ and the second crystal is a single crystal of a crystalline oxide.

[8] The crystalline multilayer structure according to [7], wherein a mask layer is interposed between the crystalline substrate and the first crystalline layer.

[9] A semiconductor device using the crystalline multilayer structure according to any one of to [8].

[10] A method of manufacturing a crystalline multilayer structure, including providing a crystalline substrate, providing a stress relaxation layer on the crystalline substrate, and providing a crystalline oxide layer having a single crystal of a crystalline oxide on the stress relaxation layer, wherein the stress relaxation layer includes a polycrystal containing κ-Ga$_2$O$_3$.

[11] The manufacturing method according to [10], wherein the crystalline substrate is a sapphire substrate.

[12] The manufacturing method according to [10] or [11], wherein the stress relaxation layer has an unevenness portion including concavities and/or convexities formed on at least a part of the surface of the stress relaxation layer.

[13] The manufacturing method according to any one of [10] to [12], wherein the stress relaxation layer is provided by forming the unevenness portion on the crystalline substrate directly or via another layer, and then forming the stress relaxation layer on the unevenness portion.

[14] The manufacturing method according to [13], wherein the unevenness portion is formed by arranging a mask regularly on the crystalline substrate directly or via another layer.

[15] The manufacturing method according to [14], wherein the stress relaxation layer is formed on the mask.

[16] The manufacturing method according to [14] or [15], wherein the mask layer includes a metal oxide of a Group 4 metal of the Periodic Table.

[17] The manufacturing method according to [16], wherein the Group 4 metal of the Periodic Table is titanium, zirconium, or hafnium.

[18] The manufacturing method according to any of [10] to [17], wherein the crystalline oxide comprises at least gallium.

[18] The manufacturing method according to any of [10] to [18], wherein the crystalline oxide has the corundum structure.

[20] The manufacturing method according to any one of [1]-[19], wherein the dislocation density of the crystalline oxide layer is 1×10$^7$/cm$^2$ or less.

The crystalline multilayer structure according to the embodiment of the disclosure includes a high-quality crystalline layer. Further, by the method of manufacturing a crystalline multilayer structure according to an embodiment of the disclosure, a crystalline multilayer structure can be industrially advantageously obtained.

DETAILED DESCRIPTION

Figure 1:
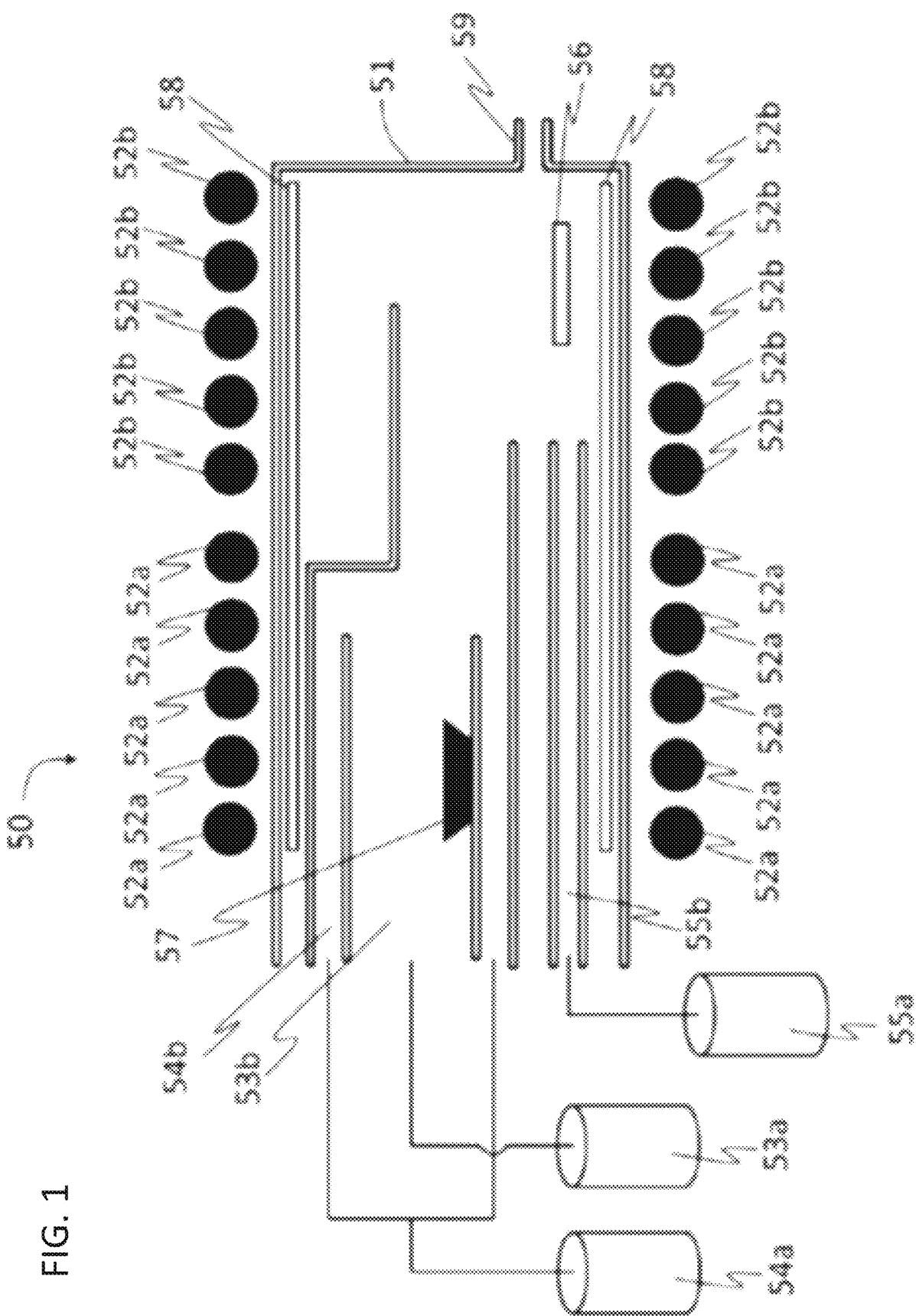
FIG. 1 is a diagram illustrating a HVPE apparatus used in an embodiment of the disclosure.

A crystalline multilayer structure according to an embodiment of the disclosure includes a first crystalline layer having a first crystal, and a second crystalline layer stacked on the first crystalline layer and having a second crystal, wherein the first crystal includes polycrystalline κ-Ga$_2$O$_3$ and the second crystal is a single crystal of a crystalline oxide. In an embodiment of the disclosure, it is preferable that at least a portion of the second crystalline layer is formed to be in contact with the first crystalline layer. A crystalline multilayer structure according to another embodiment of the disclosure includes a crystalline substrate, a first crystalline layer stacked on the crystalline substrate and having a first crystal, and a second crystalline layer stacked on the first crystalline layer and having a second crystal, wherein the first crystal includes polycrystalline κ-Ga$_2$O$_3$ and the second crystal is a single crystal of a crystalline oxide. In an embodiment of the disclosure, it is preferable to form the crystalline oxide layer so that at least a portion of the crystalline oxide layer is in contact with the stress relaxation layer. The "single crystal" refers to a crystal consisting a single crystallite crystal, the crystal plane and axis are aligned. In addition, "polycrystalline" refers to a crystal in which two or more crystallites having different crystal planes and crystal axes are bonded or integrated via grain boundaries.

(First Crystalline Layer)

The first crystalline layer includes a first crystal. The first crystals are not particularly limited as long as they include polycrystalline κ-Ga$_2$O$_3$. In an embodiment of the disclosure, it is preferable that the first crystalline layer contains the polycrystal as a main component. The term "main component" means, for example, the atomic ratio of gallium in the metal element in the first crystalline layer is 0.5 or more when the first crystalline layer contains Ga$_2$O$_3$ as a main component. In an embodiment of the disclosure, the atomic ratio of gallium in the metal element in the first crystalline layer is preferably 0.7 or more, more preferably 0.8 or more. The thickness of the first crystalline layer is not particularly limited, and may be 1 μm or more, or may be 1 μm or less. In an embodiment of the disclosure, the first crystalline layer may have an amorphous portion.

(Second Crystalline Layer)

The second crystal is not particularly limited as long as it is a single crystal of a crystalline oxide. The second crystalline layer preferably includes a second crystal as a main component. In addition, in an embodiment of the disclosure, the crystalline oxide may be a semiconductor. Examples of the crystalline oxide include crystals of a metal oxide containing one or more kinds of metals selected from aluminum, gallium, indium, iron, chromium, vanadium, titanium, rhodium, nickel, cobalt, and iridium. In an embodiment of the disclosure, it is preferable that the crystalline oxide contains at least one kind of metal selected from aluminum, indium, and gallium, more preferably at least gallium, and most preferably a crystalline gallium oxide or a mixed crystal thereof. The crystal structure of the crystalline oxide is not particularly limited as long as it does not deviate the object of the disclosure. The crystal structure of the crystalline oxide includes, for example, the corundum structure, the β-Gallia structure, the hexagonal crystal structure (the ε-type structure, for example), the rectangular crystal structure (the κ-type structure, for example), the cubic crystal structure, or the tetragonal crystal structure. In an embodiment of the disclosure, the crystalline oxide preferably has the corundum structure, the β-Gallia structure, or the hexagonal crystal (the ε-type structure, for example), and more preferably has the corundum structure. By combining such a preferred second crystalline layer and the preferred first crystalline layer described above, it is possible to make the quality of crystallinity and the like of the second crystalline layer improved. The term main component means that the second crystal is preferably contained in an atomic ratio of 50% or more, more preferably 70% or more, and still more preferably 90% or more, based on all components of the second crystalline layer, and may be 100%. The thickness of the second crystalline layer is not particularly limited, but is preferably 10 μm or more, more preferably 30 m or more, and most preferably 50 μm or more. In addition, in an embodiment of the disclosure, it is preferable that the second crystalline layer includes a lateral growth portion. The lateral growth portion is not particularly limited as long as it is a portion grown in a lateral direction or a substantially lateral direction with respect to the thickness direction of the second crystalline layer. In an embodiment of the disclosure, when the first crystalline layer includes a single crystal, it is preferable that the crystal structure of the crystalline oxide and the crystal structure of the single crystal in the first crystalline layer are the same. This is because the quality of the lateral growth portion of the second crystalline layer can be improved. It is more preferable that the crystalline oxide and the single crystal constituent material in the first crystalline layer are the same.

The second crystalline layer may contain a dopant. The dopant is not particularly limited and may be a known material, and may be an n-type dopant or a p-type dopant. Examples of the n-type dopant include tin, germanium, silicon, titanium, zirconium, vanadium, niobium, or two or more of these elements. Examples of the p-type dopant include Mg, H, Li, Na, K, Rb, Cs, Fr, Be, Ca, Sr, Ba, Ra, Mn, Fe, Co, Ni, Pd, Cu, Ag, Au, Zn, Cd, Hg, Ti, Pb, N, P, or two or more of these elements. The content of the dopant is also not particularly limited, but is preferably 0.00001 atomic % or more, more preferably 0.00001 atomic % to 20 atomic %, and most preferably 0.00001 atomic % to 10 atomic % in the second crystalline layer.

In the method for manufacturing a crystalline multilayer structure by, for example, providing a first crystalline layer and a second crystalline layer on a crystalline substrate, the crystalline multilayer structure forms the first crystalline layer containing polycrystalline κ-$Ga_2O_3$ on the crystalline substrate, and further forms the second crystalline layer containing a single crystal of crystalline oxide on the first crystalline layer. The crystalline multilayer structure can be suitably obtained by such a manufacturing method, for example. Form of the first crystalline layer and the second crystalline layer can be made using known means. That is, a method for manufacturing a crystalline multilayer structural body in which a crystalline oxide layer (second crystalline layer) containing a single crystal of a crystalline oxide is formed on a crystalline substrate via a stress relaxation layer (first crystalline layer), and a polycrystal containing κ-$Ga_2O_3$ can be suitably obtained as the stress relaxation layer.

(Stress Relaxation Layer)

The stress relaxation layer (first crystalline layer) is not particularly limited as long as it includes polycrystalline including κ-$Ga_2O_3$. In an embodiment of the disclosure, it is preferable that the stress relaxation layer includes polycrystalline containing κ-$Ga_2O_3$ as a main component. The term "main component" means, for example, the atomic ratio of gallium in the metallic element in the stress relaxation layer is 0.5 or more when the stress relaxation layer contains $Ga_2O_3$ as a main component. In an embodiment of the disclosure, the atomic ratio of gallium in the metal element in the stress relaxation layer is preferably 0.7 or more, more preferably 0.8 or more. The thickness of the stress relaxation layer is not particularly limited, and may be 1 m or more, or 1 μm or less. In an embodiment of the disclosure, the stress relaxation layer may include an amorphous portion. In an embodiment of the disclosure, as the stress relaxation layer, it is also preferable to form a stress relaxation layer having concavities and convexities formed of concavities or convexities on at least a part of its surface. This is because the quality of the crystalline oxide layer can be improved. Such a stress relaxation layer can be preferably made, for example, by forming the unevenness portion on the surface of the crystalline substrate, and then forming the stress relaxation layer on the unevenness portion using the above-mentioned preferable forming means.

The shape or the like of the unevenness portion of the stress relaxation layer may be the same as the shape or the like of the unevenness portion on the crystalline substrate described above. The means for depositing the crystalline oxide layer is not particularly limited as long as it is a means for obtaining a crystalline oxide layer containing a single crystal of a crystalline oxide, and may be a known means. The deposition means, for example, CVD method, MOCVD method, MOVPE method, mist-CVD method, mist-epitaxy method, MBE method, HVPE method, pulse-growth method or ALD method can be applied. In an embodiment of the disclosure, the deposition means is preferably a mist CVD method, a mist epitaxy method, or a HVPE method, and more preferably a HVPE method. In an embodiment of the disclosure, the methods and the conditions and the like of depositing the crystalline oxide layer may be the same as those of the means for depositing the stress relaxation layer.

(Crystalline Oxide Layer)

The crystalline oxide layer (second crystalline layer) is not particularly limited as long as it contains a single crystal of a crystalline oxide. In an embodiment of the disclosure, it is preferable to include a single crystal of the crystalline oxide as a main component. The crystal structure of the crystalline oxide is not particularly limited. By combining such a preferred crystalline oxide layer with the preferred stress relaxation layer described above, it is possible to make the quality such as crystallinity of the crystalline oxide layer improved. The term "main component" means that the crystalline oxide is preferably contained in an atomic ratio of 50% or more, more preferably 70% or more, and still more preferably 90% or more, based on all components of the crystalline oxide layer, and may be 100%. The thickness of the crystalline oxide layer is not particularly limited, but is preferably 10 μm or more, more preferably 30 μm or more, and most preferably 50 μm or more.

In an embodiment of the disclosure, it is preferable that the crystalline oxide layer includes a lateral growth portion. The lateral growth portion is not particularly limited as long as it includes a portion grown in a lateral direction or a substantially lateral direction with respect to the thickness direction of the crystalline oxide layer. In an embodiment of the disclosure, when the stress relaxation layer includes a single crystal, it is preferable that the crystal structure of the crystalline oxide and the crystal structure of the single crystal in the stress relaxation layer are the same. This is because crystallinity such as a lateral growth portion of the crystalline oxide layer can be improved. It is more preferable that the crystalline oxide and the single crystal constituent material in the stress relaxation layer are the same. The content of the crystalline oxide layer dopant is also not particularly limited, but is preferably 0.00001 atomic % or more, more preferably 0.00001 atomic % to 20 atomic %, and most preferably 0.00001 atomic % to 10 atomic % in the crystalline oxide layer.

(Crystalline Substrate)

The crystalline substrate is not particularly limited as long as it is a substrate containing a crystalline substance as a main component, and may be a known substrate. The crystalline substrate may be an insulator substrate, may be a conductive substrate, or may be a semiconductor substrate. The crystalline substrate may be a single crystalline substrate, or may be polycrystalline substrate. Examples of the crystalline substrate include a substrate containing a crystal having the corundum structure as a main component, a substrate containing a crystal having the β-Gallia structure as a main component, and a substrate containing a crystal having the hexagonal crystal structure as a main component. The term "main component" refers to a composition ratio in a substrate containing 50% or more of the crystalline material, preferably 70% or more, and more preferably 90% or more.

Examples of the substrate containing a crystal having the corundum structure as a main component include a sapphire substrate and an α-$Ga_2O_3$ substrate. Substrates containing a crystalline material having the above-described β-Gallia structure as a main component include, for example, a β-$Ga_2O_3$ substrate or a mixed crystalline substrate including a β-$Ga_2O_3$ and a $Al_2O_3$. As a mixed crystalline substrate including a β-$Ga_2O_3$ and a $Al_2O_3$, a mixed crystalline substrate containing $Al_2O_3$ more than 0% and 60% or less atomic ratio is exemplified as a preferred example. The substrate having the hexagonal structure, a SiC substrate, a ZnO substrate, and a GaN substrate, for example. Examples of other crystalline substrates include, for example, Si substrates.

In an embodiment of the disclosure, it is preferable that the crystalline substrate is a sapphire substrate. As the sapphire substrate, c-plane sapphire substrate, m-plane sapphire substrate, and a-plane sapphire substrate can be used, for example. The sapphire substrate may have an off angle. The off angle of the sapphire substrate is not particularly limited, but is preferably 0° to 15°. The thickness of the crystalline substrate is not particularly limited, but is preferably 50 μm to 2000 μm, more preferably 200 μm to 800 μm.

In the embodiment of the disclosure, it is preferable that the unevenness portion having concavities and/or convexities is formed on the crystalline substrate directly or via another layer, and the first crystalline layer is formed on the unevenness portion because the crystalline multilayer structure can be obtained more efficiently. The stress relaxation layer may constitute the unevenness portion. The unevenness portion is not particularly limited as long as it is composed of concavities and/or convexities, and may be an unevenness portion composed of concavities or an unevenness portion composed of convexities. The unevenness portion may be formed of regular concavities and/or convexities, or may be formed of irregular concavities and/or convexities. In the embodiment of the disclosure, it is preferable that the unevenness portion is formed periodically, and it is more preferable that the unevenness portion is formed periodically and regularly patterned. The shape of the unevenness portion is not particularly limited, and for example, a stripe shape, a dot shape, a mesh shape, or a random shape can be applied. In the embodiment of the disclosure, a dot shape or a stripe shape is preferable. When the unevenness portions are patterned periodically and regularly, it is preferable that the pattern shape of the unevenness portions is a polygonal shape such as a triangle, a square (such as a rectangle or a trapezoid, and a pentagonal), a hexagon, a circle, an ellipse, or the like. In the case of forming the unevenness portion in a dot shape, the lattice shape of the dot may be a square lattice, an orthorhombic lattice, a triangular lattice, a hexagonal lattice, for example, and more preferably a triangular lattice. The cross-sectional shape of the concavity or convexity of the unevenness portion is not particularly limited, C-shaped, U-shaped, inverted U-shaped, corrugated, or polygonal shape such as triangular, square (including square, rectangular, or trapezoidal), pentagonal, hexagon or the like, for example.

The constituent material of the convexities is not particularly limited, and may be a known material. The constituent material may of the convexities may be an insulator material, may be a conductive material, or may be a semiconductor material. The constituent material of the convexities may be amorphous, single crystal, or polycrystalline. Examples of the material of the convexities include oxides, nitrides, or carbides such as Si, Ge, Ti, Zr, Hf, Ta, and Sn, carbon, diamond, metal, and mixtures thereof. More specifically, examples include a Si-containing compound containing $SiO_2$, SiN, or polycrystalline silicon as a main component, and a metal having a melting point higher than the crystal growth temperature of the crystalline oxide (a noble metal such as platinum, gold, silver, palladium, rhodium, iridium, or ruthenium, for example). In the embodiment of the disclosure, it is preferable that the constituent material of the convexities includes a metal oxide of a metal of Group 4 of the Periodic Table (such as Ti, Zr, Hf) because the polycrystal can be formed more efficiently, it is more preferable that the constituent material includes a metal oxide of Ti, and it is most preferable that the constituent material includes titanium oxide. The content of the constituent material is preferably 50% or more, more preferably 70% or more, and most preferably 90% or more, in the convexities at a composition ratio. The means for forming the convexities may be a known means, for example, photolithography, electron beam lithography, laser patterning, and known patterning means such as subsequent etching (including dry etching or wet etching). In the embodiment of the disclosure, it is preferable that the convexity has a stripe shape or a dot shape, and more preferably a dot shape. In the embodiment of the disclosure, it is also preferable that the crystalline substrate is a PSS (Patterned Sapphire Substrate). The pattern shape of the PSS is not particularly limited, and may be a known pattern shape. The pattern shapes include, for example, conical, bell-shaped, domed, hemispherical, square, or triangular pole shapes. In the embodiments of the disclosure, the pattern shapes are preferably conical. In the embodiment of the disclosure, the pitch interval of the pattern shape is not particularly limited. It is preferably 5 µm or less, more preferably 1 µm to 3 µm.

In addition, in the embodiment of the disclosure, it is preferable that the formation of the convexities is performed by forming a mask layer on the crystalline substrate. The mask layer can be suitably formed by forming a constituent material of the mask layer by a known film forming means such as a vacuum evaporation method, a CVD method, or a sputtering method, for example, and then processing the constituent material by the above-mentioned known patterning means. Examples of the constituent material of the mask layer include a material exemplified as a constituent material of the convexities. In an embodiment of the disclosure, when a crystalline multilayer structure is manufactured using the mask layer, it is preferable to form the first crystalline layer (stress relaxation layer) on the mask layer. It is more preferable to form the first crystalline layer (stress relaxation layer) on the mask layer having a thickness of 100 nm or less because a second crystalline layer (crystalline oxide layer) having a thicker film and reduced dislocation can be obtained. It is most preferable to form the first crystalline layer (stress relaxation layer) on the mask layer having a thickness of 50 nm or less because the dislocation density of the second crystalline layer (crystalline oxide layer) can be $1 \times 10^7/cm^2$ or less. The dislocations explained above refers to edge dislocations, screw dislocations, or a mixture thereof. It is preferable that the constituent material of the mask layer contains a metal oxide of a transition metal, more preferably a metal oxide of a Group 4 metal of the Periodic Table, and most preferably a titanium oxide. By making the constituent materials of the mask layer preferable as described above, $\kappa$-$Ga_2O_3$ polycrystalline can be more easily formed, and the crystallinity of the second crystalline layer (crystalline oxide layer) can be further improved.

The concavities are not particularly limited, but may be the same as or a substrate as the constituent material of the convexities described above. In an embodiment of the disclosure, it is preferable that the concavities are a void layer provided on the surface of the substrate. As the means for forming the concavities, the same means as the means for forming the convexities can be used. The void layer can be formed on the surface of the substrate by providing a groove on the substrate using known groove processing methods. In an embodiment of the disclosure, the void layer can be suitably formed by providing a mask layer by sputtering, for example, and then performing patterning processing using a known patterning processing means such as photolithography. The groove width, groove depth, terrace width, and the like of the void layer are not particularly limited as long as they do not deviate the object of the disclosure, and can be appropriately designed.

Hereinafter, preferred embodiment of a crystalline substrate suitably used in an embodiment of the disclosure will be described with reference to the accompanying drawings.

Figure 2:
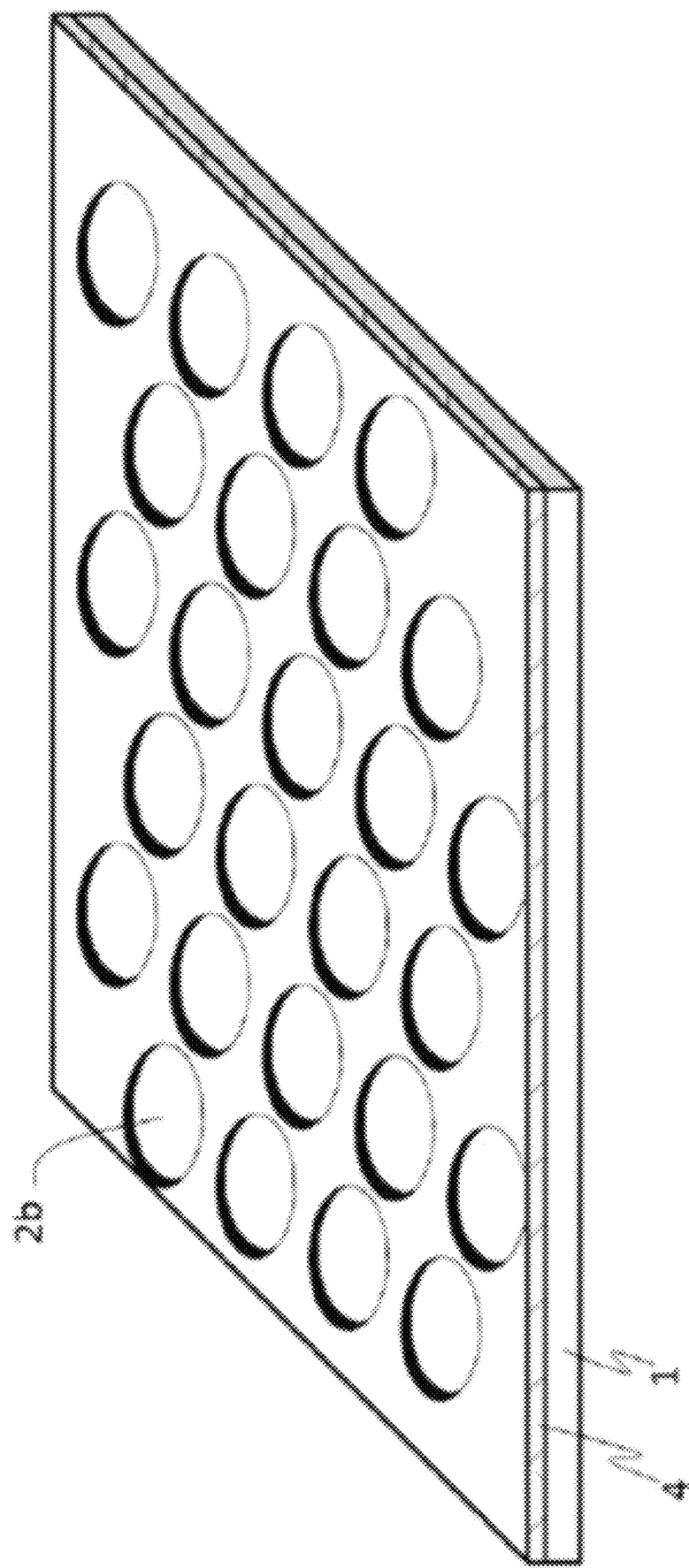
FIG. 2 is a diagram schematically illustrating a surface of an unevenness portion formed on a surface of a substrate used in an embodiment of the disclosure.
Figure 3:
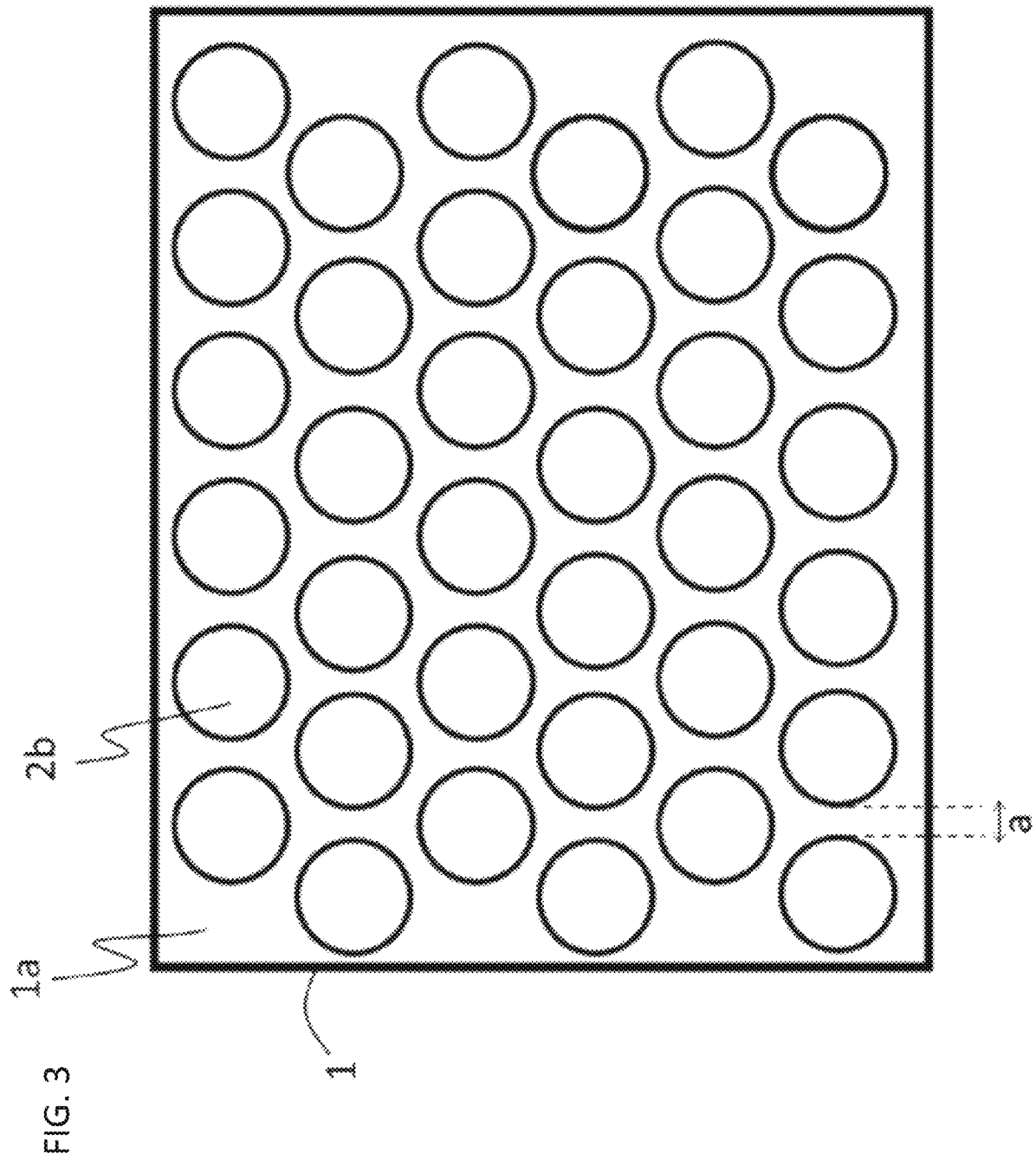
FIG. 3 is a schematic view schematically illustrating a surface of an unevenness portion formed on a surface of a substrate used in an embodiment of the disclosure.

FIG. 2 shows one mode of the unevenness portion provided on the crystal growth surface of the crystalline substrate in an embodiment of the disclosure. Unevenness portion of FIG. 2 includes a crystalline substrate 1 and a mask layer 4. FIG. 3 shows the surface of the unevenness portion shown in FIG. 2 as viewed from the top direction. As can be seen from FIGS. 2 and 3, the mask layer 4 is formed on the crystal growth plane of the crystalline substrate 1, holes are vacant in a dot shape. From the holes of the dots of the mask layer 4 crystalline substrate 1 is exposed, the dot-shaped recess 2b is formed in a triangular lattice shape. The dot circles are provided at intervals of a predetermined period "a". The period "a" is not particularly limited, but is preferably 1 µm to 1 mm, and more preferably 5 µm to 300 µm in an embodiment of the disclosure. Here, the period "a" refers to the distance between the ends of the circles of adjacent dots. The mask layer 4 can be formed by forming a constituent material of the mask layer 4, and then processing the constituent material into a predetermined shape using a known means such as photolithography. Examples of the constituent material of the mask layer 4 include oxides, nitrides or carbides of Si, Ge, Ti, Zr, Hf, Ta, Sn, Al, for example, carbon, diamond, metal, or mixtures thereof. In an embodiment of the disclosure, it is preferable that the mask layer 4 contains a metal oxide of a transition metal, more preferably a metal oxide of a Group 4 metal of the Periodic Table, and most preferably a titanium oxide. By making the constituent materials of the mask layer preferable as described above, $\kappa$-$Ga_2O_3$ polycrystalline can be more easily formed, and the crystallinity of the second crystalline layer (crystalline oxide layer) can be further improved. Further, the deposition methods of the mask layer 4 is not particularly limited, and may be a known means. Examples of the deposition means of the material constituting the mask layer 4 include a vacuum evaporation method, a CVD method, and a sputtering method. In an embodiment of the disclosure, when the mask layer contains titanium oxide, it is preferable to use a sputtering method, and in particular, by using a reactive sputtering method, polycrystalline oxide can be more suitably formed on the mask layer 4. Among them, it is most preferable to use a reactive sputtering method in which $O_2$ gases are supplied.

Figure 4:
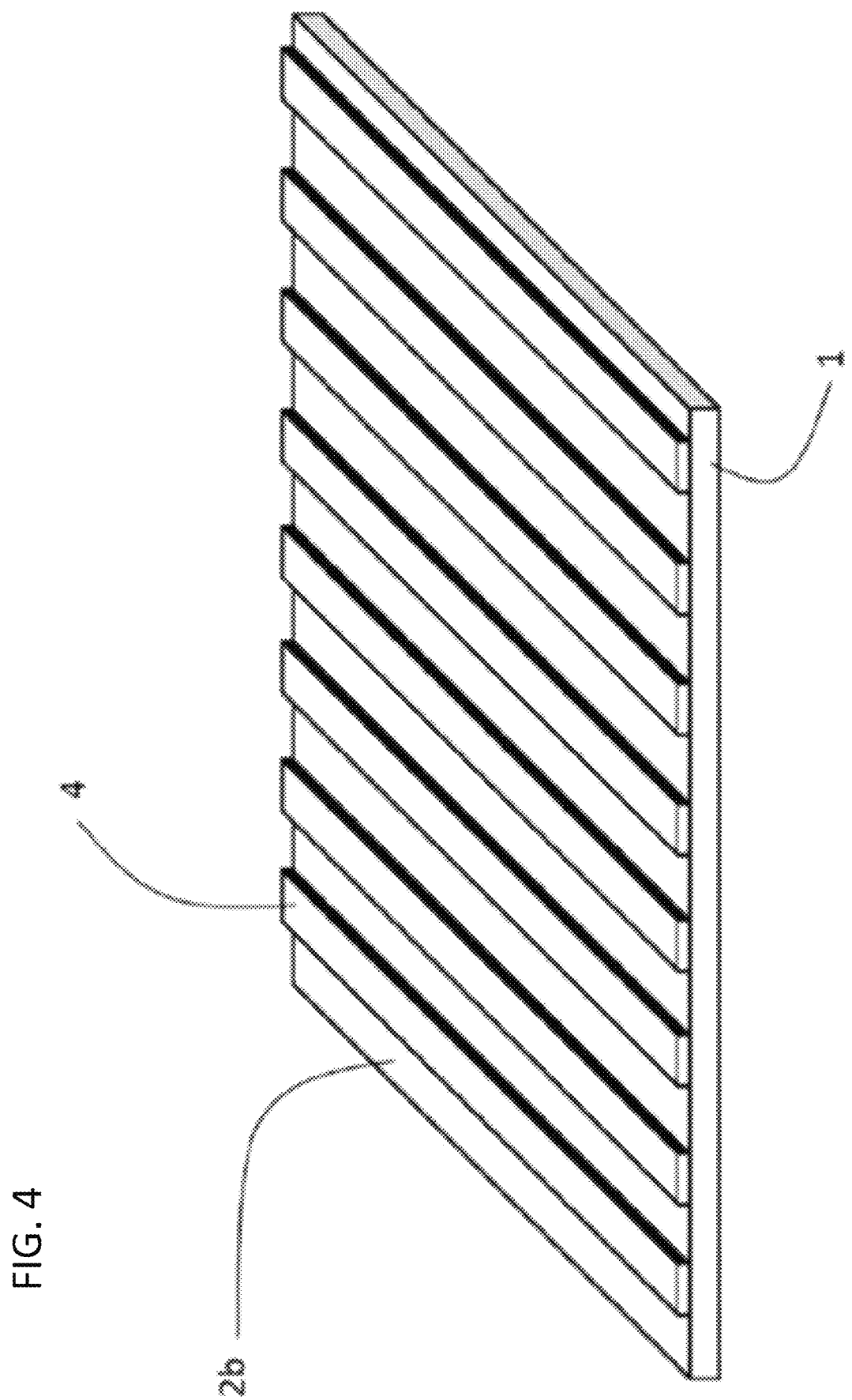
FIG. 4 is a schematic view illustrating an example of the concavities and convexities portion formed on the surface of the substrate used in the embodiment of the disclosure.
Figure 5A:
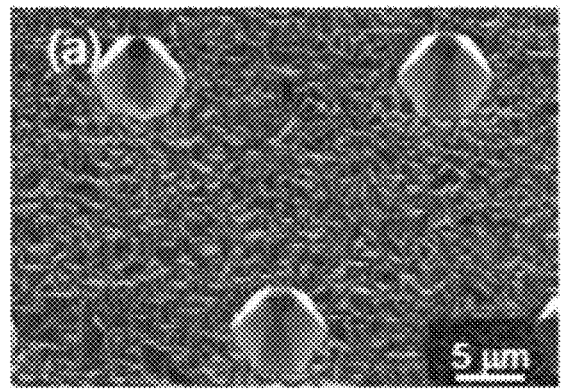
FIG. 5A and FIG. 5B illustrate bird's-eye view and a cross-sectional view after 40 minutes, respectively, of the SEM observation results in Examples.
Figure 5B:
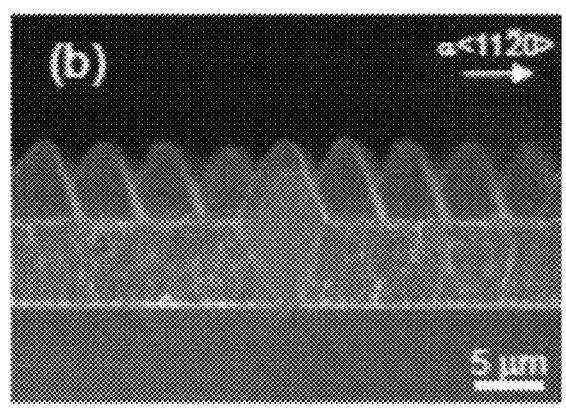
Figure 5C:
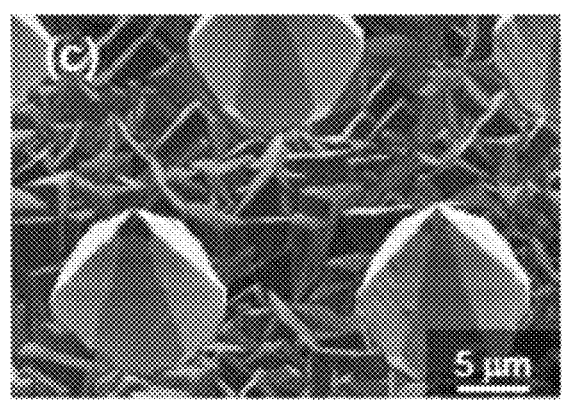
FIG. 5C and FIG. 5D illustrate a bird's-eye view and a cross-sectional view after 2 hours, respectively.
Figure 5D:
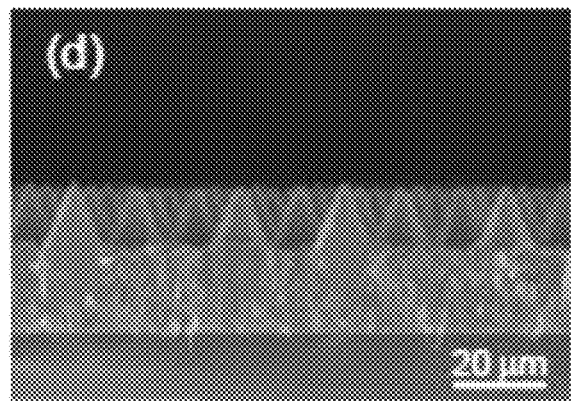
Figure 5E:
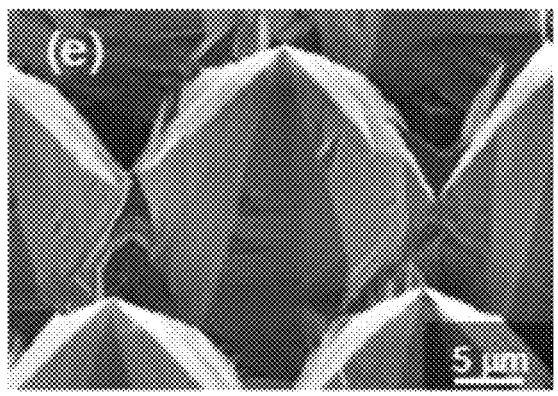
FIG. 5E and FIG. 5F illustrate a bird's-eye view and a cross-sectional view after 5 hours, respectively, of the SEM observation results in Examples.
Figure 5F:
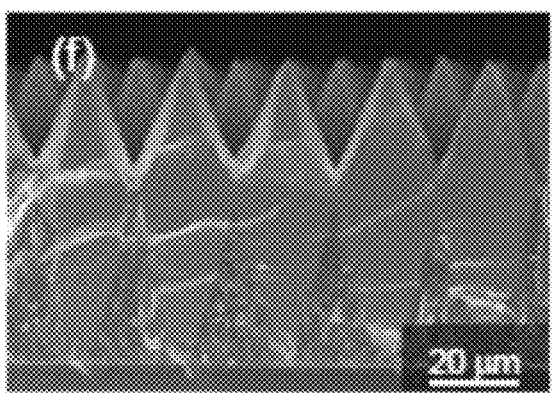
Figure 6A:
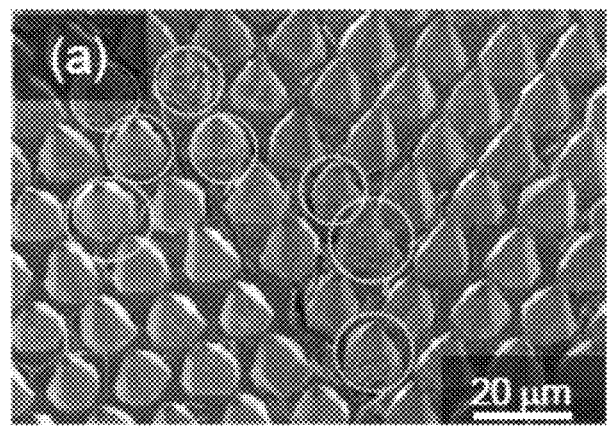
FIG. 6A illustrates an SEM bird's-eye view of a comparative example.
Figure 6B:
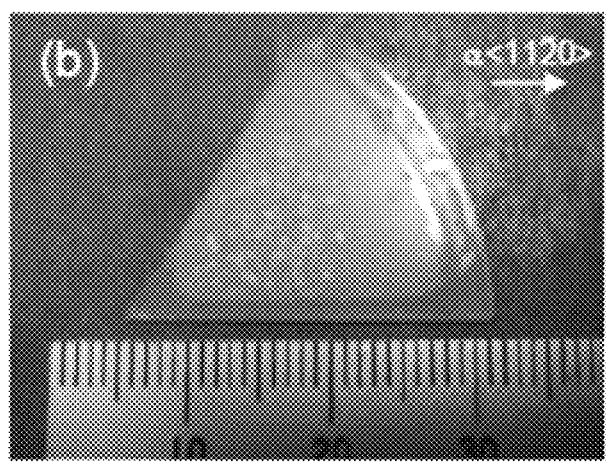
FIG. 6B shows a photograph of a comparative example.
Figure 6C:
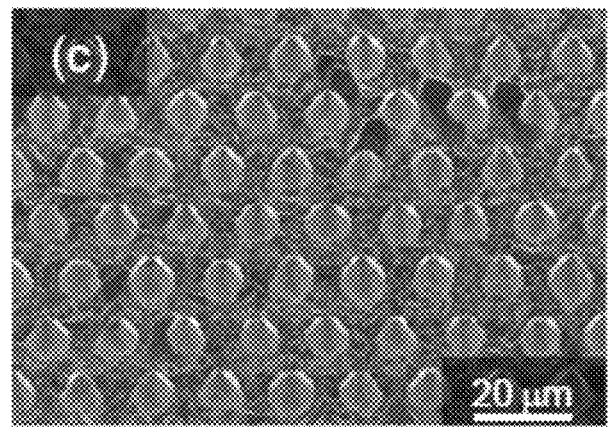
FIG. 6C illustrates an SEM bird's-eye view of an example.
Figure 6D:
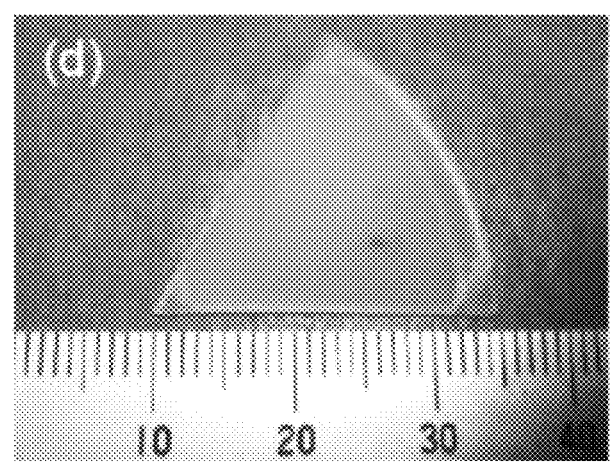
FIG. 6D shows a photograph of an example.

FIG. 4 shows one mode of the unevenness portion provided on the crystal growth surface of the crystalline substrate in an embodiment of the disclosure. The unevenness portion in FIG. 4 includes a crystalline substrate 1 and a mask layer 4. The mask layer 4 is formed in a stripe shape on the crystal growth plane of the crystalline substrate 1, and the concavity portion (groove) 2b is formed in a stripe shape by the mask layer 4. The mask layer 4 can be formed by a known means such as photolithography. Examples of the constituent material of the mask layer 4 include oxides, nitrides or carbides of Si, Ge, Ti, Zr, Hf, Ta, Sn, Al, carbon, diamond, metal, or mixtures thereof. In an embodiment of the disclosure, it is preferable that the mask layer 4 contains a metal oxide of a transition metal, more preferably a metal oxide of a Group 4 metal of the Periodic Table, and most preferably a titanium oxide. By making the constituent materials of the mask layer preferable as described above, $\kappa$-$Ga_2O_3$ polycrystalline can be more easily formed, and the crystallinity of the second crystalline layer (crystalline oxide layer) can be further improved. The width and height of the convexities (mask layer) of the unevenness portion, the width and depth of the concavities, the interval, and the like are not particularly limited, but in an embodiment of the disclosure, the width of the convexities (mask layer) is preferably from about 1 µm to about 1 mm, more preferably from about 5 µm to about 300 µm, and most preferably from about 10 m to about 100 µm. In an embodiment of the disclosure, the height of the convexities (mask layer) is preferably from about 1 nm to about 10 m, more preferably from about 5 nm to about 1 m, and most preferably from about 10 m to about 100 nm. In an embodiment of the disclosure, the width of the recess is preferably from about 1 µm to about 300 µm, more preferably from about 3 µm to about 100 µm, and most preferably from about 5 µm to about 50 µm. In an embodiment of the disclosure, the depth of the concavities is preferably from about 1 nm to about 1 mm, more preferably from about 10 nm to about 300 µm, and most preferably from about 20 nm to about 100 µm. By making the unevenness portion preferred as described above, it is possible to obtain an improved crystalline multilayer structure more easily. The unevenness portion may be formed directly on the crystalline substrate or may be provided with another layer interposed therebetween.

In an embodiment of the disclosure, a buffer layer including a stress relaxation layer or the like may be provided on the crystalline substrate, and in the case of providing a buffer layer, the unevenness portion may also be formed on the buffer layer. In an embodiment of the disclosure, it is preferable that the substrate has a buffer layer on a part of or all the surface. The methods for forming the buffer layer are not particularly limited, and may be a known means. Such buffer layer formation methods include, for example, the Spray Method, the Mist CVD Method, HVPE Method, MBE Method, MOCVD Method, and Sputtering Method. In an embodiment of the disclosure, it is preferable that the buffer layer is formed by a mist CVD method. This is because the film quality of the crystal film deposited on the buffer layer becomes more excellent, and crystal defects such as screw dislocations can be suppressed.

Figure 10:
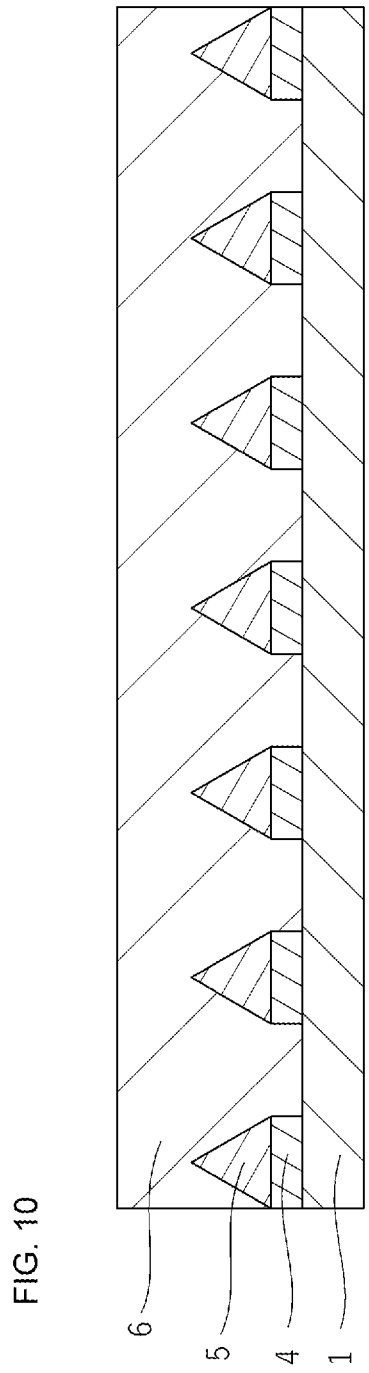
FIG. 10 is a schematic diagram illustrating a crystalline multilayer structure.

The means for depositing the stress relaxation layer is not particularly limited as long as it can form the polycrystal. Also, the means for depositing the first crystalline layer and the second crystalline layer is not particularly limited. Both layers may be formed by known means. The stress relaxation layer, the first crystalline layer and the second crystalline layer, may be deposited by CVD method, MOCVD method, MOVPE method, mist-CVD method, mist-epitaxy method, MBE method, HVPE method, pulse-growth method, ALD method or sputtering method, for example. In an embodiment of the disclosure, the deposition means is preferably a mist CVD method, a mist epitaxy method, or a HVPE method, and more preferably a HVPE method. In an embodiment of the disclosure, it is preferable that the means for depositing the first crystalline layer and the second crystalline layer be the same. This is because the first crystalline layer and the second crystalline layer can be formed successively and efficiently. FIG. 10 is a schematic illustration of a crystalline multilayer structure formed as a result of the deposition of a mask layer 4, a first crystalline layer (a stress relaxation layer) 5, and a second crystalline layer (crystalline oxide layer) 6 on a crystalline substrate 1.

Embodiments of the disclosure will be described in more detail below by exemplifying a case where a HVPE method is used to form a first crystalline layer or a second crystalline layer (hereinafter collectively referred to as a "crystalline layer") and a stress relaxation layer. Specifically, metal halide gas is produced by in-situ chemical reaction between halogen-contained gas and a metal source in the HVPE method. Then, the metal halide gas and the oxygen-containing raw material gas are supplied to the crystalline substrate in the reaction chamber. At this time, it is preferable that the reactive gas is also supplied onto the crystalline substrate and the deposition is performed under the flow of the reactive gas.

(Metal Source)

The metal source is not particularly limited as long as it contains a metal and the metal halide gas can be produced, and may be an elemental metal or a metal compound. Examples of the metal include one or more kinds of metals selected from gallium, aluminum, indium, iron, chromium, vanadium, titanium, rhodium, nickel, cobalt, and iridium. In an embodiment of the disclosure, the metal is preferably one or more kinds of metals selected from gallium, aluminum, and indium, more preferably gallium. It is most preferable that the metal source is a simple substance of gallium. Further, the metal source may be a gas, a liquid, or a solid. In an embodiment of the disclosure, when gallium is used as the metal, for example, it is preferable that the metal source is a liquid phase.

The methods for producing the metal halide gas are not particularly limited as long as it does not deviate the object of the disclosure, and may be a known means. The halogenating agent used for the halogenation is not particularly limited as long as the metal source can be halogenated, and may be a known halogenating agent. Examples of the halogenating agent include halogen or hydrogen halide. Examples of the halogen include fluorine, chlorine, bromine, or Iodine. Examples of the hydrogen halide include hydrogen fluoride, hydrogen chloride, hydrogen bromide, and hydrogen iodide. In an embodiment of the disclosure, hydrogen halide is preferably used for the halogenation, and hydrogen chloride is more preferably used. In an embodiment of the disclosure, it is preferable that the production of gas is performed by supplying halogen or hydrogen halide as a halogenating agent to the metal source to react the metal source with halogen or hydrogen halide at a temperature higher than or equal to the vaporization temperature of the metal halide to form a metal halide. The halogenation reaction temperature in an embodiment of the disclosure is preferably 900° C. or less, more preferably 700° C. or less, and most preferably 400° C. to 700° C., when the metal source is gallium and the halogenating agent is HCl. The metal halide gas is not particularly limited as long as it is a gas containing a halide of a metal of the metal source. Examples of the metal halide gas include halides (fluoride, chloride, bromide, iodide, and the like) of the metal.

In an embodiment of the disclosure, a metal source containing a metal is gasified by producing a metal halide gas, and then the metal halide gas and the oxygen-containing raw material gas are supplied onto a substrate in the reaction chamber. In addition, in an embodiment of the disclosure, a reactive gas is supplied onto the substrate. Although there is no particular limitation on the deposition temperature of the crystalline layer and the stress relaxation layer, in an embodiment of the disclosure, when the metal source is gallium and the halogenating agent is HCl, for example, it is preferably 900° C. or less, more preferably 700° C. or less, and most preferably 400° C. to 700° C. In the embodiment of the disclosure, it is preferable that the deposition of the first crystalline layer or the stress relaxation layer is performed at a low temperature (such as less than 500° C.), and the deposition of the second crystalline layer or the crystalline oxide layer is performed at a high temperature (such as 500° C. or higher). Thereby, each of the first crystalline layer and the second crystalline layer, and the stress relaxation layer and the crystalline oxide layer can be deposited in a better condition. As the oxygen-containing raw material gases, one or more gases are selected from $O_2$ gases, $CO_2$ gases, NO gases, $NO_2$ gases, $N_2O$ gases, $H_2O$ gases and $O_3$ gases, for example. In the embodiment of the disclosure, the oxygen-containing raw material gas is preferably one or more gases selected from $O_2$, $H_2O$ and $N_2O$, and more preferably $O_2$. The reactive gas is usually a reactive gas different from the metal halide gas and the oxygen-containing raw material gas, and an inert gas is excepted. The reactive gas is not particularly limited, and an etching gas is selected, for example. The etching gas is not particularly limited as long as it does not deviate the object of the disclosure, and may be a known etching gas. In an embodiment of the disclosure, the reactive gas is preferably a halogen gas (such as fluorine gas, chlorine gas, bromine gas or Iodine gas), a hydrogen halide gas (such as fluoric acid gas, hydrochloric acid gas, hydrogen bromide gas or hydrogen iodide gas), a hydrogen gas or a mixed gas of two or more thereof, and preferably contains hydrogen halide gas, and most preferably contains hydrogen chloride. The metal halide gas, the oxygen-containing raw material gas, and the reactive gas may contain a carrier gas. Examples of the carrier gas include an inert gas such as nitrogen or argon. Although the partial pressure of the metal halide gas is not particularly limited, in an embodiment of the disclosure, it is preferably 0.5 Pa to 1 kPa, and more preferably 5 Pa to 0.5 kPa. In an embodiment of the disclosure. the partial pressure of the oxygen-containing raw material gas is not particularly limited, but is preferably 0.5 to 100 times, more preferably 1 to 20 times, of the partial pressure of the metal halide gas. In an embodiment of the disclosure, the partial pressure of the reactive gas is also not particularly limited, but is preferably 0.1 times to 5 times, more preferably 0.2 times to 3 times, of the partial pressure of the metal halide gas. In an embodiment of the disclosure, it is also preferable to supply the dopant-containing raw material gas to the substrate.

The dopant-containing raw material gas is not particularly limited as long as it contains a dopant. Although there is no particular limitation on the dopant, in an embodiment of the disclosure, it is preferable that the dopant contains one or more kinds of elements selected from germanium, silicon, titanium, zirconium, vanadium, niobium and tin, more preferably germanium, silicon, or tin, and most preferably germanium. By using the dopant-containing source gas in this manner, the electric conductivity of the obtained film can be easily controlled. The dopant-containing raw material gas preferably has the dopant in the form of a compound (such as a halide and an oxide), more preferably in the form of a halide. The partial pressure of the dopant-containing raw material gas is not particularly limited, but in an embodiment of the disclosure, it is preferable that the partial pressure of the dopant-containing raw material gas is $1\times10^{-7}$ times to 0.1 times, of the partial pressure of the metal-containing raw material gas, and more preferably $2.5\times10^{-6}$ times to $7.5\times10^{-2}$ times. In an embodiment of the disclosure, it is preferable that the dopant-containing raw material gas is supplied onto the substrate together with the reactive gas.

The crystalline multilayer structure according to an embodiment of the disclosure can be suitably applied to a semiconductor device, and is particularly useful for a power device. Semiconductor devices provided using the crystalline multilayer structure include MIS, transistors such as HEMT and MOS, TFT, Schottky barrier diodes utilizing semiconductor-metal junctions, PN or PIN diodes combined with other P layers, and light-receiving devices. In an embodiment of the disclosure, the crystalline multilayer structure may be adopted as it is to a semiconductor device or the like. In an embodiment of the disclosure, the crystalline substrate and/or the first crystalline layer and the second crystalline layer may be separated from the substrate and the like using a known means and applied to a semiconductor device or the like. In an embodiment of the disclosure, the crystalline multilayer structure is separated from a substrate or the like by using a known means, and is applied to a semiconductor device.

Figure 7:
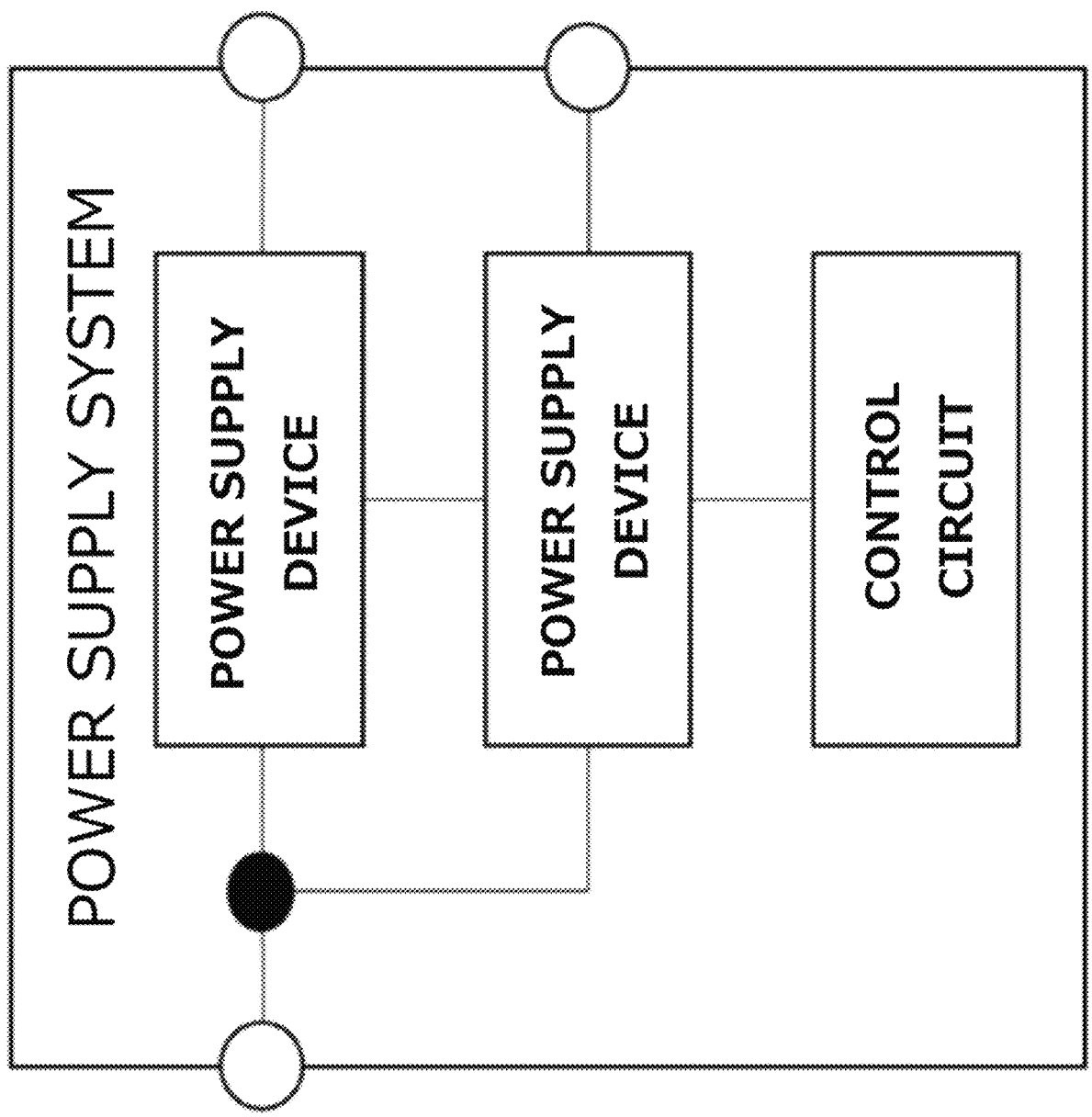
FIG. 7 is a schematic diagram illustrating a suitable example of a power supply system according to an embodiment of the disclosure.
Figure 8:
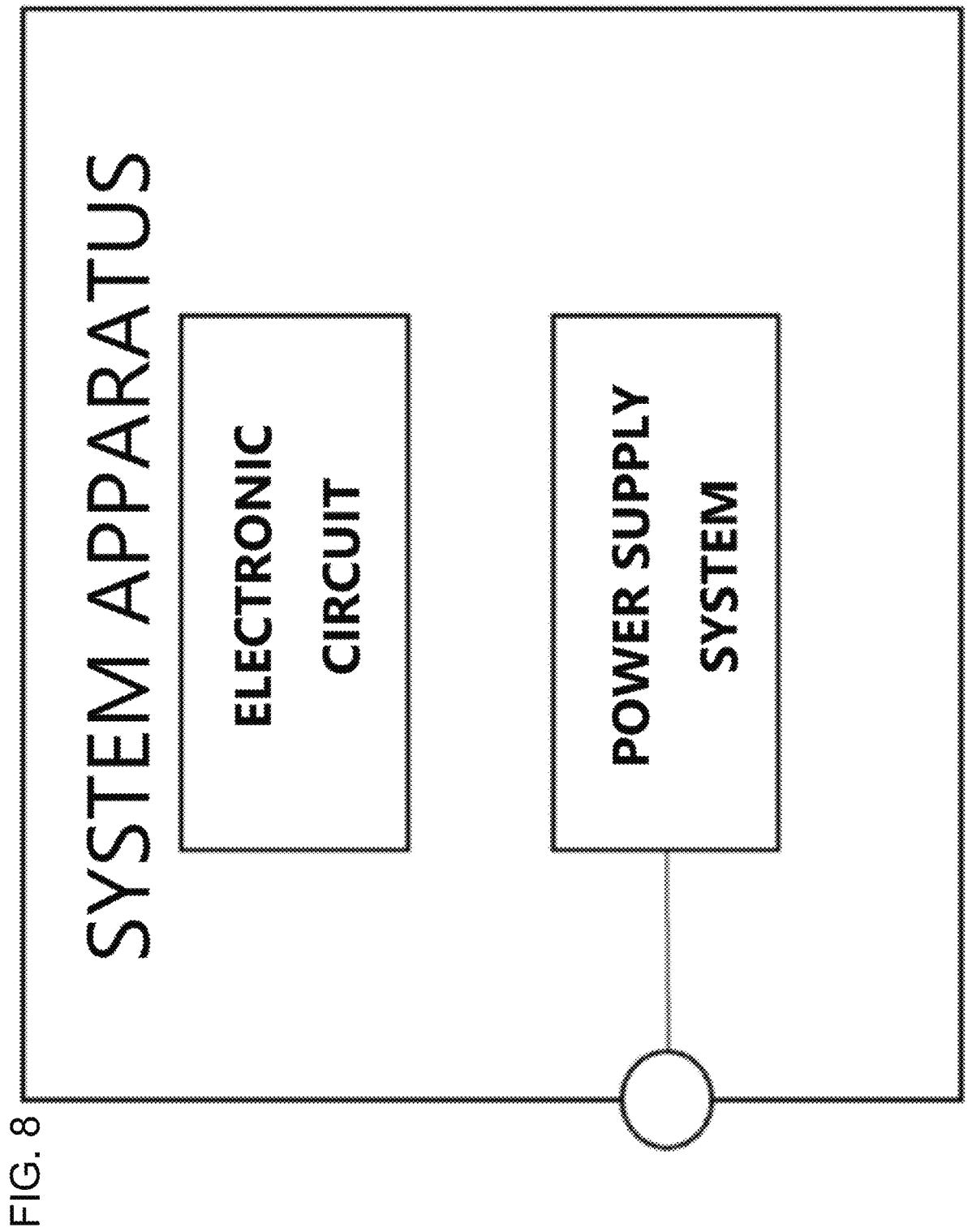
FIG. 8 is a schematic diagram illustrating a suitable example of a system apparatus according to an embodiment of the disclosure.
Figure 9:
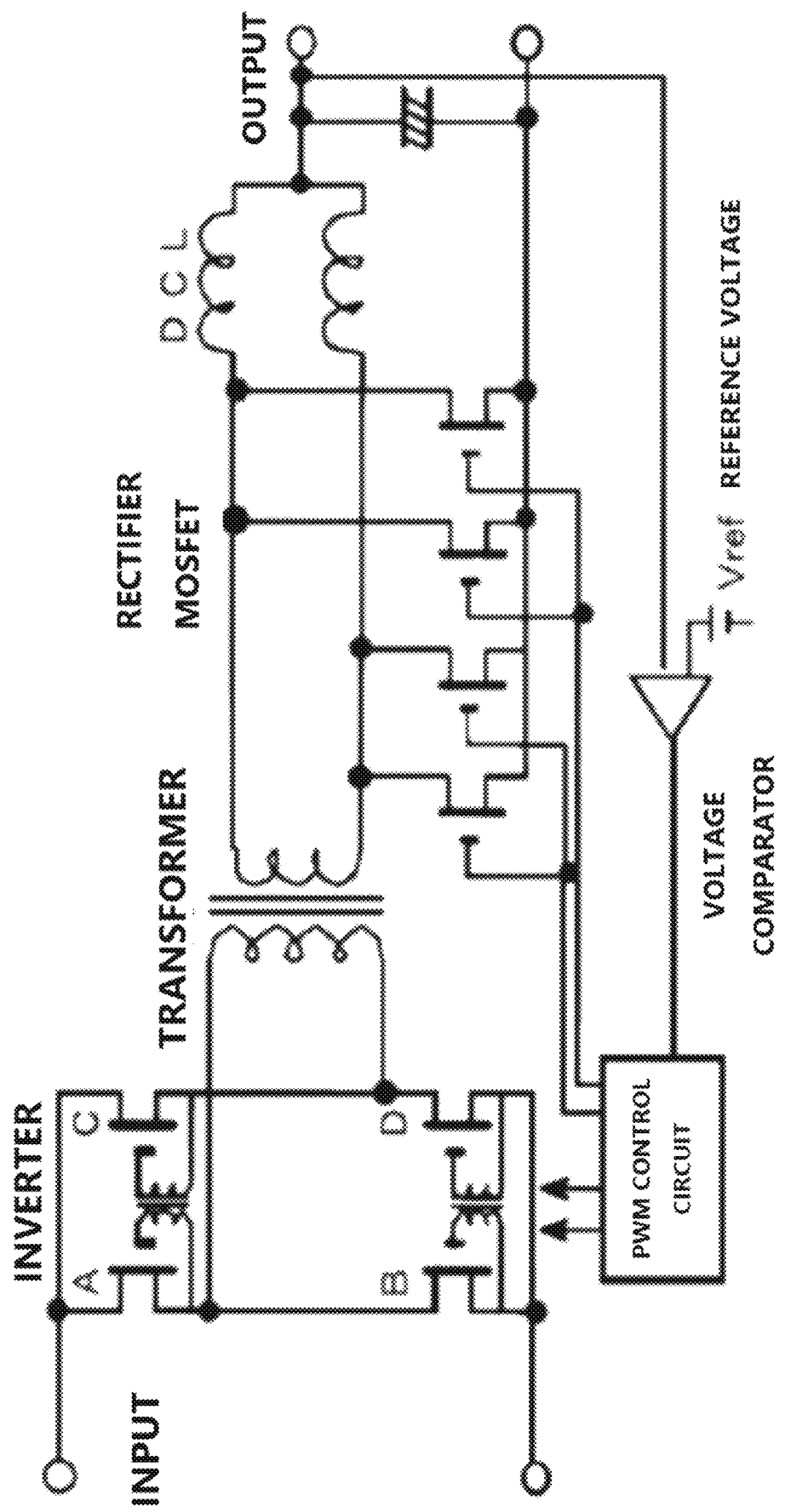
FIG. 9 is a schematic diagram illustrating a suitable example of a power supply circuit diagram of the power supply apparatus according to the embodiment of the disclosure.

In addition to the applications mentioned above, the semiconductor device according to an embodiment of the disclosure is suitably used as a power module, an inverter, or a converter by using known means. Such applications are also included in the embodiments of the disclosure. The semiconductor device according to an embodiment of the disclosure is suitably used for a semiconductor system employing a power supply apparatus, for example. The power supply apparatus can be manufactured from the semiconductor device by connecting to a wiring pattern by a known means, or can be manufactured as the semiconductor device. FIG. 7 shows an example of a power supply system. The power supply system illustrated in FIG. 7 constitutes a plurality of the power supply apparatus and a control circuit. As shown in FIG. 8, the power supply system can be applied to a system apparatus in combination with electronic circuit. An example of a power supply circuit diagram of the power supply apparatus is illustrated in FIG. 9. FIG. 9 shows a power supply circuit of a power supply unit composed of a power circuit and a control circuit. A DC voltage is switched at a high frequency by an inverter (shown as A to D in MOSFET) and converted to AC voltage, insulated, and transformed by a transformer, rectified by a rectification MOSFET, and then smoothed by a DCL (smoothing coils) and a capacitor to output a DC voltage. A voltage comparator is used to compare the output voltage with the reference voltage, and a PWM control circuit is used to control the inverter and the rectifier MOSFET to a desired output voltage.

EXAMPLES

Hereinafter, examples of the present invention will be described. Note that the present invention is not limited thereto.

Example 1

1. Formation of Mask Layer

As a substrate, a sapphire substrate (c-plane, off-angle 0.25°) having an α-$Ga_2O_3$ layer formed on its surface was used, and a mask layer containing titanium oxide was formed on the substrate by a sputtering method. Then, using a photolithography method, the formed mask layer was processed into a mask of a predetermined shape. In the sputtering method, titanium targets were used while flowing $O_2$ gases to form mask layers (50 nm thickness) containing titanium oxide. Further, the mask layer is processed by openings (dots) (diameter: 5 μm) to be arranged on the substrate in a triangular lattice shape at a period of 20 μm (distance between the ends of adjacent dots).

2. Formation of First and Second Crystalline Layers, Stress Relaxation Layers and Crystalline Oxide Layers 2-1. HVPE Apparatus A halide vapor deposition epitaxy (HVPE) apparatus 50 used in this example will be described with reference to FIG. 1. The HVPE apparatus 50 includes a reaction chamber 51, a heater 52*a* for heating a metal source 57, and a heater 52*b* for heating the substrate fixed to a substrate holder 56. Further, an oxygen-containing raw material gas supply pipe 55*b*, a reactive gas supply pipe 54*b*, and the substrate holder 56 for installing the substrate are provided in the reaction chamber 51. The reactive gas supply pipe 54*b* has a double tube structure provided with a supply gas tube 54*b* therein for supplying a metal-containing raw material gas (metal halide gas). An oxygen-containing raw material gas supply pipe 55*b* is connected to an oxygen-containing raw material gas supply source 55*a*. A flow path of the oxygen-containing raw material gas is configured so that the oxygen-containing raw material gas can be supplied from the oxygen-containing raw material gas supply source 55*a* to the substrate fixed to the substrate holder 56 via the oxygen-containing raw material gas supply pipe 55b. The reactive gas supply pipe 54b is connected to a reactive gas supply source 54a. A flow path of the reactive gas is constituted so that the reactive gas can be supplied from the reactive gas supply source 54a to the substrate fixed to the substrate holder 56 via the reactive gas supply pipe 54b. The metal-containing raw material gas supply pipe 53b is connected to a halogen-containing raw material gas supply source 53a. The halogen-containing raw material gas is supplied to the metal source to generate the metal-containing raw material gas, and the metal-containing raw material gas is supplied to the substrate fixed to the substrate holder 56. The reaction chamber 51 is provided with a gas discharge portion 59 for exhausting used gas. The inner wall of the reaction chamber 51 is provided with a protective sheet 58 which prevents the reactants from precipitating.

2-2. Preparation for Deposition

A gallium (Ga) metal source 57 (having a purity of 99.99999% or more) was placed inside the metal-containing raw material gas supply pipe 53b. The sapphire substrate with the mask layer thereon obtained in the step 1 described above was placed on the substrate holder 56 in the reaction chamber 51. Thereafter, the heaters 52a and 52b were operated to raise the internal temperature of the reaction chamber 51 to 570° C. (near the gallium metal source) and 520° C. (near the substrate holder).

2-3. Deposition of κ-$Ga_2O_3$ and α-$Ga_2O_3$

Hydrogen chloride (HCl) gas (purity 99.999% or more) was supplied from a halogen-containing raw material gas supply source 53a to the gallium metal source 57 placed inside the metal raw material-containing gas supply pipe 53b. Gallium chloride (GaCl/$GaCl_3$) was generated by chemical reactions between gallium metal and hydrogen chloride (HCl) gases. The obtained gallium chloride (GaCl/$GaCl_3$) and $O_2$ gas (purity 99.99995% or more) supplied from the oxygen-containing source gas supply source 55a were supplied onto a substrate on the substrate holder 56, together with the reactive gas through the reactive gas supply pipe 54b. Then, gallium chloride (GaCl/$GaCl_3$) and $O_2$ gas were reacted on the substrate at 520° C. under atmospheric pressure with supplying HCl gas to deposit a film on the substrate. Partial pressure of the HCl gas supplied from the halogen-containing raw material gas supply source 53a was maintained at $1.25 \times 10^{-1}$ kPa, partial pressure of the HCl gas supplied from the reactive gas supply source 54a was maintained at $1.25 \times 10^{-1}$ kPa, and partial pressure of $O_2$ gas supplied from the oxygen-containing raw material gas supply source 55a was maintained at 1.25 kPa.

2-4. Evaluation

In the above steps 2-3, the respective crystal growth after 40 minutes, 2 hours, and 5 hours was observed by SEM. The results are shown in FIG. 5. In the multilayer structure obtained in steps 2-3 described above, κ-$Ga_2O_3$ single crystals were formed on polycrystalline κ-$Ga_2O_3$ as a crystal film. The obtained crystal film had dislocation densities of $5 \times 10^6/cm^2$ or less, and no abnormal growth or cracking were found.

Example 2

A multilayer structure was produced under the same conditions as in Example 1 except that the period of the mask layer was 10 μm. A state of crystal growth and a photograph of the resulting multilayer structure is shown in FIG. 6. In the resulting multilayer structure, α-$Ga_2O_3$ single crystal was formed on polycrystalline κ-$Ga_2O_3$ as a crystal film. The obtained crystal film had dislocation densities of $5 \times 10^6/cm^2$ or less, no abnormal growths or cracks were observed.

Comparative Example 1

A multilayer structure was produced under the same conditions as in Example 1, except that $SiO_2$ was used as the mask material. A state of crystal growth and a photograph of the resulting multilayer structure is shown in FIG. 6. The obtained crystalline film of the multilayer structure had low crystallinity and abnormal growth was visible to naked eye.

The crystalline multilayer structure, the method of manufacturing the crystalline structure, and the semiconductor device according to the embodiments of the disclosure can be used in all fields such as semiconductors (such as compound semiconductor electronic devices), electronic components and electrical equipment components, optical and electrophotographic related devices, and industrial members. In particular, the crystalline multilayer structure, the method of manufacturing the crystalline structure, and the semiconductor device according to the embodiments of the disclosure are useful in the field of semiconductor devices.

The invention claimed is:

1. A manufacturing method of manufacturing a crystalline multilayer structure, the manufacturing method comprising:
providing a crystalline substrate;
providing a stress relaxation layer on the crystalline substrate; and
providing a crystalline oxide layer having a single crystal of a crystalline oxide on the stress relaxation layer,
wherein the stress relaxation layer includes κ-$Ga_2O_3$ polycrystal.

2. The manufacturing method according to claim 1, wherein the crystalline substrate is a sapphire substrate.

3. The manufacturing method according to claim 1, wherein the stress relaxation layer has an unevenness portion including concavities and/or convexities formed on at least a part of a surface of the stress relaxation layer.

4. The manufacturing method according to claim 3, wherein the stress relaxation layer is provided by forming the unevenness portion on the crystalline substrate directly or via another layer, and then forming the stress relaxation layer on the unevenness portion.

5. The manufacturing method according to claim 4, wherein the unevenness portion is formed by arranging a mask regularly on the crystalline substrate directly or via another layer.

6. The manufacturing method according to claim 5, wherein the stress relaxation layer is formed on the mask.

7. The manufacturing method according to claim 5, wherein the mask includes a metal oxide of a Group 4 metal of the Periodic Table.

8. The manufacturing method according to claim 7, wherein the Group 4 metal of the Periodic Table is titanium, zirconium, or hafnium.

9. The manufacturing method according to claim 1, wherein the crystalline oxide comprises at least gallium.

10. The manufacturing method according to claim 1, wherein the crystalline oxide has a corundum structure.

11. The manufacturing method according to claim 1, wherein the crystalline oxide layer has a dislocation density of $1 \times 10^7/cm^2$ or less.

* * * * *